United States Patent
Kawamoto et al.

(10) Patent No.: US 7,768,344 B2
(45) Date of Patent: Aug. 3, 2010

(54) POWER CIRCUIT AND POWER AMPLIFIER AND BASE STATION DEVICE USING THE SAME

(75) Inventors: Takashi Kawamoto, Kodaira (JP); Manabu Nakamura, Akishima (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 69 days.

(21) Appl. No.: 12/314,767

(22) Filed: Dec. 16, 2008

(65) Prior Publication Data
US 2009/0167427 A1 Jul. 2, 2009

(30) Foreign Application Priority Data
Dec. 26, 2007 (JP) ............................. 2007-333973

(51) Int. Cl.
*G06G 7/26* (2006.01)
(52) U.S. Cl. ..................... 327/563; 323/282; 330/297
(58) Field of Classification Search ................ None
See application file for complete search history.

(56) References Cited

U.S. PATENT DOCUMENTS

| 6,256,482 B1 | 7/2001 | Raab | |
| 6,531,853 B2 * | 3/2003 | Umemoto | 323/282 |
| 6,828,764 B2 * | 12/2004 | Takimoto et al. | 323/284 |
| 6,864,671 B2 * | 3/2005 | Bernardon | 323/282 |

FOREIGN PATENT DOCUMENTS

| JP | 2003-533116 | 4/2001 |
| WO | WO 01/86806 A2 | 4/2001 |
| WO | WO 01/86806 A3 | 4/2001 |

* cited by examiner

*Primary Examiner*—Tuan Lam
(74) *Attorney, Agent, or Firm*—Stites & Harbison PLLC; Juan Carlos A. Marquez, Esq.

(57) ABSTRACT

Disclosed are a high-efficiency power amplifier and base station device with respect to high-speed, broadband radio communication method. A broadband power supply circuit includes a linear voltage amplifier to which an input signal is applied, a resistor connected to an output side of the linear voltage amplifier, a switching regulator amplifying the voltage difference between both ends of the resistor to convert the amplified voltage difference into current, and a high frequency amplifier. The high frequency amplifier is designed to exhibit high efficiency at a frequency band where the efficiency of the switching regulator starts to be deteriorated, or at a high frequency band where the operation of the linear amplifier is dominant. In this case, the amplification of low frequency components are performed by the switching regulator, and the amplification of high frequency components are performed by the linear amplifier and the high frequency amplifier.

20 Claims, 11 Drawing Sheets

POWER CIRCUIT AND POWER AMPLIFIER AND BASE STATION DEVICE USING THE SAME

CLAIM OF PRIORITY

The present application claims priority from Japanese Patent Application 2007-333973 filed on Dec. 26, 2007, the content of which is hereby incorporated by reference into this application.

FIELD OF THE INVENTION

The present invention relates to a power supply circuit, and a power amplifier and a base station device using the power supply circuit, and more particularly, to a broadband power supply circuit that can be used in a base station while performing radio communication using broadband high frequency signals, and a power amplifier and a base station device using the broadband power supply circuit.

BACKGROUND OF THE INVENTION

A power amplifier used for a base station while performing radio communication requires small size and high performance in terms of costs. Meanwhile, for radio communication such as mobile phones and the like, a broad-banded and high-efficiency power amplifier is required as the dedicated power amplifier for a base station because of accelerate of its communication speed and becoming broad-banded. There is an EER (Envelope Elimination and Restoration) method as one of the methods to meet this requirement, one example of which is disclosed in, for example, a specification of U.S. Pat. No. 6,256,482.

A power supply circuit using the EER method should convert a broadband envelope signal into power of a power amplifier with high efficiency. There is a method disclosed in, for example, Japanese Patent Application National Publication No. 2003-533116 of a power supply circuit that amplifies a broadband envelope signal with high efficiency.

SUMMARY OF THE INVENTION

The above JP A National Publication No. 2003-533116 discloses a power supply circuit that amplifies a broadband envelope signal with high efficiency. For example, the power supply circuit shown in its FIG. 6 employs a switching regulator having an inverter that is composed of transistors and an inductor. The operation frequency of the switching regulator becomes nearly equal to the frequency of the envelope signal as the frequency of the envelope signal becomes fast.

FIG. 11 shows a relationship between the efficiency and the operation frequency of the switching regulator. However, the switching regulator has a characteristic of starting the deterioration of efficiency when the operation frequency exceeds a certain frequency. Accordingly, the power supply circuit disclosed in the above JP A National Publication No. 2003-533116 has a linear amplifier, and is operated so that the linear amplifier compensates for the deterioration in efficiency of the switching regulator when receiving an envelope signal that has a frequency at which the efficiency of the switching regulator begins to deteriorate. However, the linear amplifier generally does not have high efficiency and its band is not broad, either. For this reason, when the efficiency of the switching regulator begins to deteriorate at a high frequency band as shown in FIG. 11, even though the linear amplifier compensates for the operation of the switching regulator, the overall efficiency of the power supply circuit is deteriorated. The reason could be due to the shortage of usable high efficiency bands in the case of using an amplifier for a base station which is dedicated to broadband radio communication because the band at which the efficiency of the power supply circuit begins to deteriorate becomes nearly equal to the band at which the efficiency of the switching regulator begins to deteriorates.

A main object of the present invention is to provide a power supply circuit that has high efficiency over a wide range while including a high-speed, broadband input signal, a power amplifier used in a radio communication system using the power supply circuit, and a base station device using the power supply circuit.

A representative example of the present invention is as follows. That is, a broadband power supply circuit according to the present invention includes a linear amplifier which receives a broadband input signal from an input terminal; a current-voltage converter arranged between an output side of the linear amplifier and an output terminal; a switching regulator that amplifies a voltage difference generated across the current-voltage converter, converts the amplified voltage difference into a current, and outputs the converted current to the output terminal; and a high frequency amplifier that amplifies a voltage difference generated across the current-voltage converter, converts the amplified voltage difference into a current, and outputs the converted current, wherein an output current of the high frequency amplifier is added to an output current of the linear amplifier and supplied to the current-voltage converter, and wherein the high frequency amplifier has the maximized amplification contribution ratio at a high frequency band of the broadband input signal.

The present invention may provide a high-efficiency, broadband power supply circuit that may apply to a high-speed, broadband radio communication system, a power amplifier, and a base station device using the power supply circuit.

DETAILED DESCRIPTION OF THE PREFERRED EMBODIMENTS

The present invention has been made in consideration of high-speed, broadband communication that includes features of a switching regulator having high efficiency at relatively low frequency bands of an input signal, a linear amplifier generally has low efficiency but may realize relatively high-efficient operations at specific frequency bands, and a high frequency amplifier may realize high-efficiency operations within only limited frequency bands.

According to a representative exemplary embodiment, a broadband power supply circuit includes a linear voltage amplifier that receives an input signal, a resistor connected to the output side of the linear voltage amplifier, a switching regulator that amplifies the voltage difference between both ends of the resistor to convert the amplified voltage difference into to a current, and a high frequency amplifier. The switching regulator is designed to output desired power, and the linear amplifier is designed to operate at a desired band.

At this time, the high frequency amplifier is designed to have high efficiency at a frequency band where the efficiency of the switching regulator begins to deteriorate or at a high frequency band where the operation of the linear amplifier is dominant. In this case, the amplification of low frequency components is mainly performed by the switching regulator, and the amplification of high frequency components is performed by the linear amplifier and the high frequency amplifier. As a result, power of a signal having low frequency components is effectively amplified by the switching regulator, and power of a signal having high frequency components is effectively amplified by the linear amplifier or high frequency amplifier without any distortion. Accordingly, it may be possible to realize a broadband power supply circuit that may amplify a broadband signal more effectively than the prior art.

In addition, "low frequency components" and "high frequency components" are relative terms and this merely means that a certain frequency component is defined with respect to another frequency component. Moreover, the low frequency components include a DC component.

Hereinafter, exemplary embodiments of the subject invention will be described in detail with reference to accompanying drawings.

First Embodiment

A broadband power supply circuit according to a first embodiment of the subject invention will be described with reference to FIG. 1 to FIG. 4.

Figure 1:
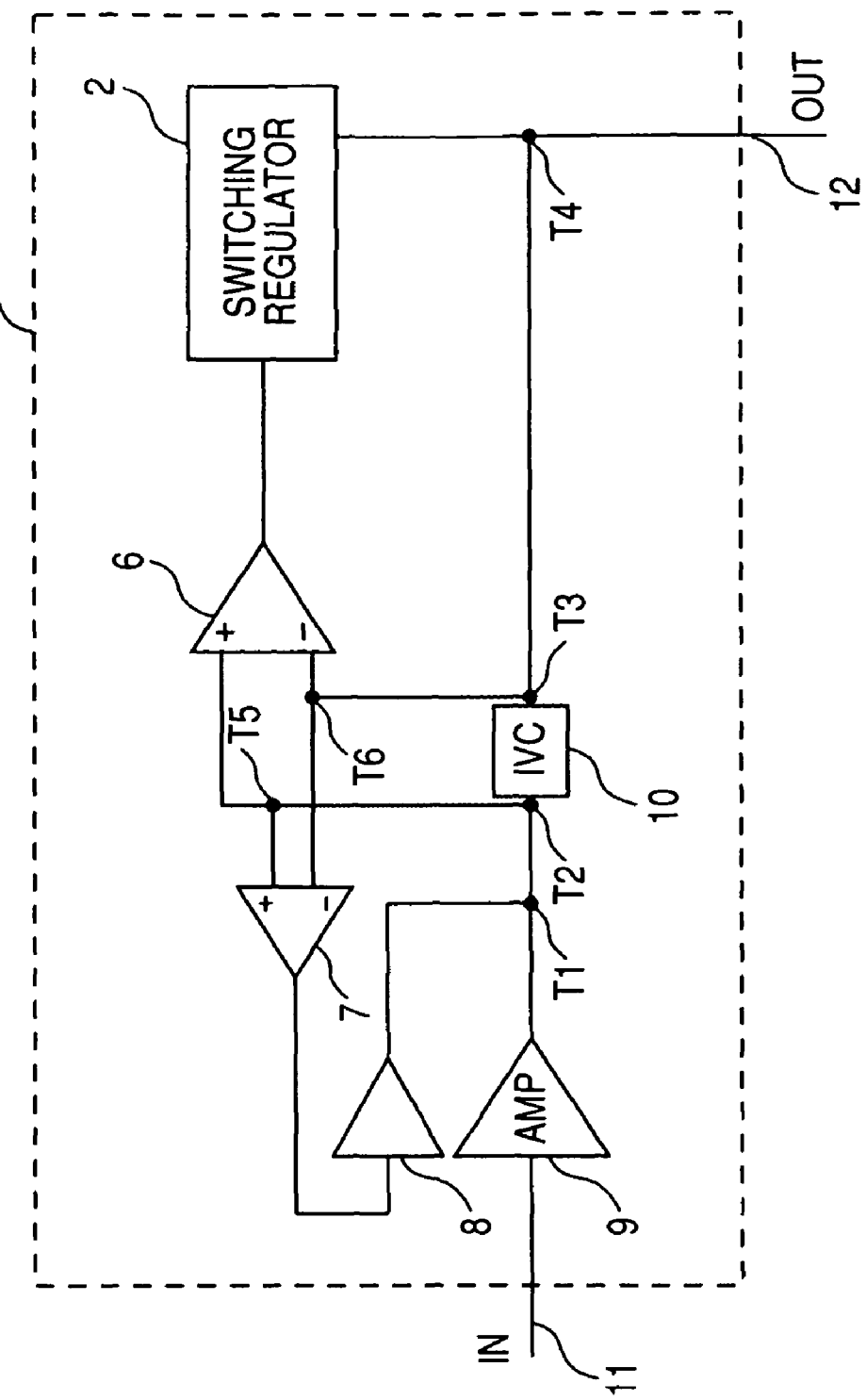
FIG. 1 is a block diagram illustrating a broadband power supply circuit according to a first embodiment of the present invention.

FIG. 1 is a block diagram illustrating a broadband power supply circuit according to the first embodiment. The broadband power supply circuit 1 includes an input terminal, a switching regulator 2, a first comparator 6, a second comparator 7, a high frequency amplifier 8, a linear amplifier 9, a current-voltage converter 10, and an output terminal. A broadband input signal 11 that includes a DC component or a low frequency component to a high frequency component is inputted from the input terminal to the linear amplifier 9. Reference numeral 12 refers to an output signal.

The linear amplifier 9 has an input side connected to the input terminal of the broadband power supply circuit 1 and an output side connected to the output terminal of the broadband power supply circuit 1 through the current-voltage converter 10. An output side of the switching regulator 2 is also connected to the output terminal of the broadband power supply circuit 1 so that the output signal 12 of the broadband power supply circuit 1 is outputted from the output terminal. The current-voltage converter 10 is configured as a resistor having small resistance, for example, a few ohms.

The voltage between both ends of the current-voltage converter 10 (between terminals T2 and T3) is inputted to the first comparator 6 via terminals T5 and T6 as an input voltage and compared by the first comparator 6, and the compared output voltage becomes an input signal of the switching regulator 2. In addition, the voltage between both ends of the current-voltage converter 10 (between the terminals T2 and T3) is inputted to the second comparator 7 via the terminals T5 and T6 as an input voltage and compared by the second comparator 7, and the compared output voltage becomes an input signal of the high frequency amplifier 8. An output of the high frequency amplifier 8 is superimposed on an output of the linear amplifier 9 at the terminal T1.

In the first embodiment, the linear amplifier 9 has a function to linearly amplify an input signal having a relatively high frequency region with good efficiency. The switching regulator 2 has a function of a D-class amplifier and amplifies power of a signal having low frequency components with good efficiency. An amplification element of the D-class amplifier merely functions as a switch, and its output signal are outputted in a pulse train which turns ON/OFF a power supply according to the input signal. An ON/OFF switching operation may constitute a high-efficiency amplifier because the element has minimum resistance.

Further, the high frequency amplifier 8 is a saturation (digital) amplifier or linear amplifier that amplifies a high frequency input signal having a narrower band than that of the linear amplifier 9 with higher efficiency. The high frequency amplifier 8 uses, for example, an E-class amplifier.

Figure 2:
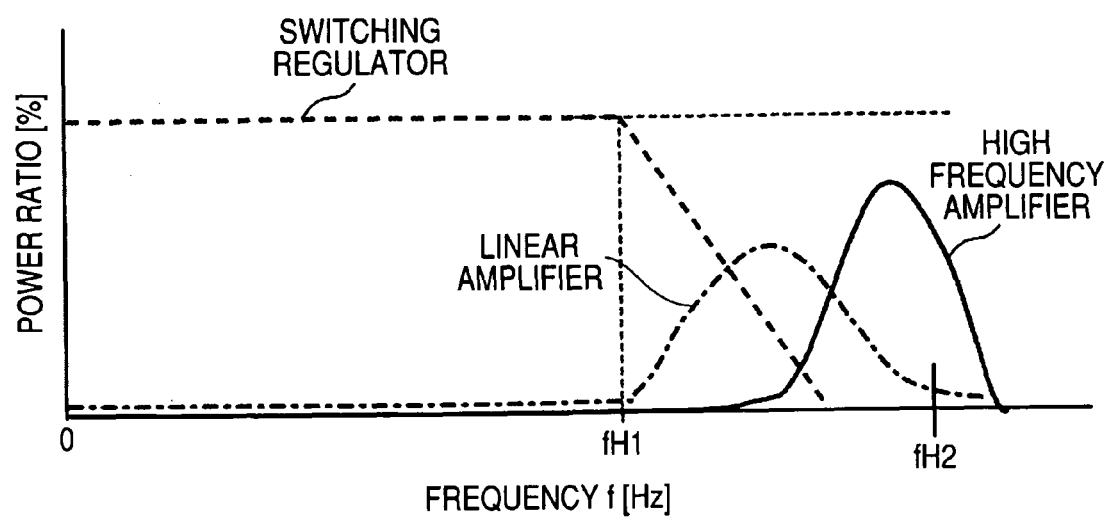
FIG. 2 is a graph illustrating a relationship between the power contribution ratio and the frequency of input signals of a switching regulator, a linear amplifier, and a high frequency amplifier that constitutes the broadband power supply circuit shown in FIG. 1.

A relationship between each power contribution ratio (power ratio) of the three amplifiers (switching regulator 2, high frequency amplifier 8, and linear amplifier 9) that constitute the broadband power supply circuit 1 and the frequency of the input signal 11 is shown in FIG. 2 as a design example. The switching regulator 2 primarily amplifies the input signal 11 at a low frequency band of the input signal 11. That is, the power amplification contribution ratio of the switching regulator 2 is maximized at a frequency band ranging from a DC component to a low frequency component (first frequency band).

When the frequency band of the input signal 11 is raised to reach a band (second frequency band) that exceeds a frequency fH1 (for example, about 1 MHz to about 10 MHz) at which the amplification efficiency of the switching regulator 2 begins to be deteriorated, the power amplification contribution ratio of the linear amplifier 9 is increased. As the frequency of the input signal 11 reaches a higher high-frequency band, that is, a high frequency band (third frequency band) located near an upper limit of the frequency fH2 (for example, 100 MHz), which is designed to be effectively used as a basis of a design value of the broadband power supply circuit 1, the amplification efficiency of the linear amplifier 9 deteriorates correspondingly. The present invention has been designed so that the amplification efficiency of the high frequency amplifier 8 is maximized at this high frequency band to maximize the amplification contribution ratio of the high frequency amplifier 8 at the high frequency band (third frequency band). Even though operation region of the high frequency amplifier 8 or the linear amplifier 9 has been enlarged in FIG. 2 for simplification in understanding, the dominant region of the switching regulator 2 is larger than the operation region in the actual power supply circuit, for example, the region of the switching regulator 2 reaches about 90% of the entire region.

Accordingly, it may be possible to realize the broadband power supply circuit 1 that can consistently amplify with high efficiency the input signal 11 including broadband frequency components ranging from a DC component or a low frequency component to a high frequency component, for example, up to about 100 MHz, and output the output signal 12.

In addition, even though a relationship between the frequency of the input signal 11 and each power contribution ratio of the switching regulator 2, the high frequency amplifier 8, and the linear amplifier 9 has been described at three regions separated from each other in the example shown in FIG. 2, this is merely an example, and the contribution ratio of each amplifier may be set so that reducing in the efficiency of the switching regulator 2 is compensated by the other two amplifiers using the second frequency band and the third frequency band as a single frequency band.

Figure 3:
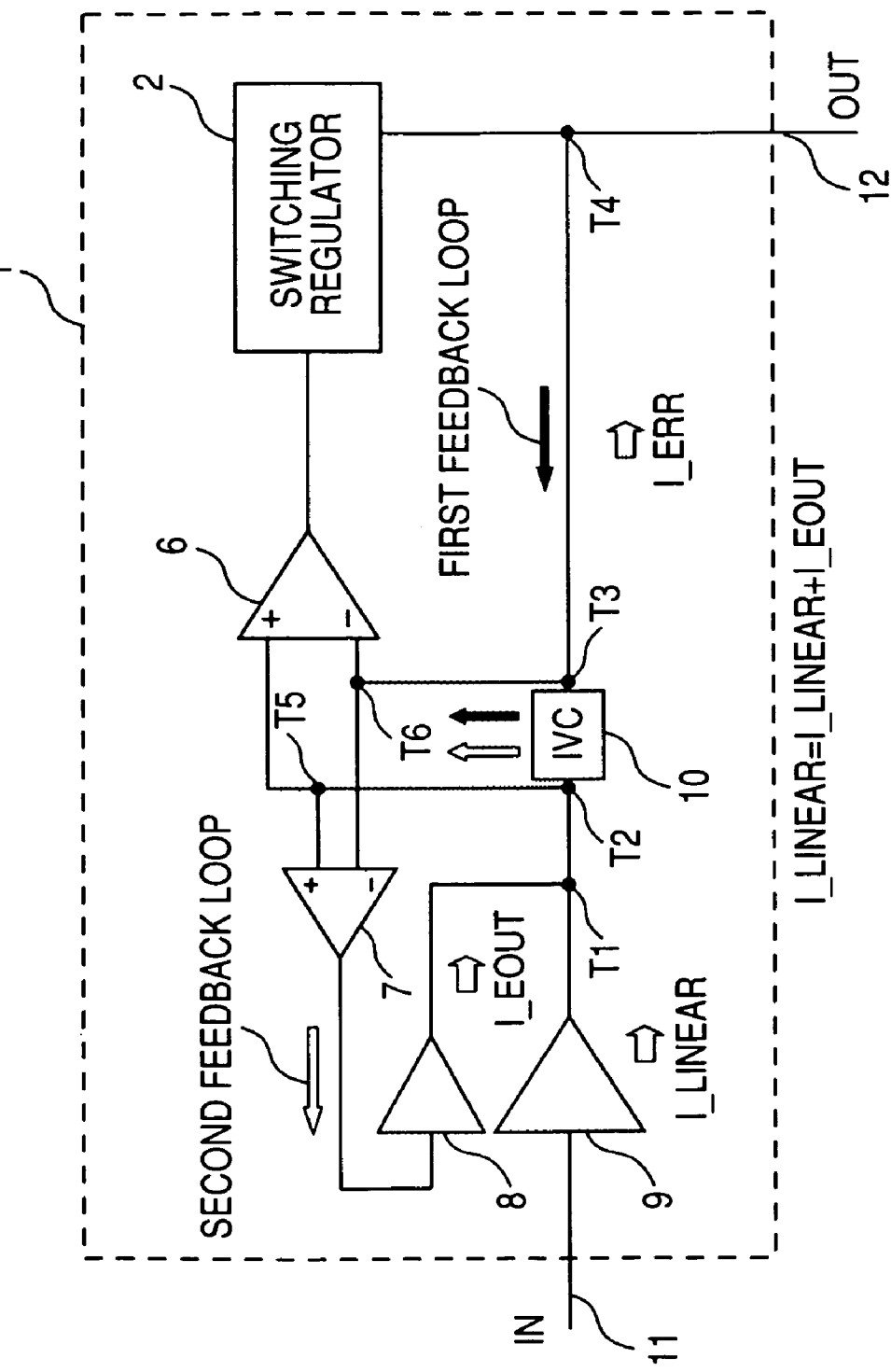
FIG. 3 is a view illustrating an operation of the broadband power supply circuit shown in FIG. 1.

An operation of the broadband power supply circuit 1 will be briefly described with reference to FIG. 3. There is provided a first feedback loop reaching from the output side of the switching regulator 2 to the switching regulator 2 via the terminal T4, the current-voltage converter 10 (terminals T2 and T3), the terminals T5 and T6, and the first comparator 6. There is also provided a second feedback loop reaching from the output side of the high frequency amplifier 8 to the high frequency amplifier 8 via the terminal T1, the current-voltage converter 10 (terminals T2 and T3), the terminals T5 and T6, and the second comparator 7. In other words, the first feedback loop and the second feedback loop, respectively, are connected to both ends of the current-voltage converter 10 and therefore, a current amplified by the switching regulator 2 or the high frequency amplifier 8 is outputted corresponding to a difference in voltage between both ends of the current-voltage converter 10 based on the frequency characteristics shown in FIG. 2.

That is, the power supply circuit according to the first embodiment detects an output current of the linear amplifier 9 and the high frequency amplifier 8 by the current-voltage converter 10, inputs the detected result to the first comparator 6, and outputs the compared result. The output signal of the first comparator 6 is inputted to the switching regulator 2. The switching regulator 2 amplifies the output signal of the first comparator 6 with high efficiency. Further, a signal between both ends of the current-voltage converter 10 is also inputted to the second comparator 7, and the compared result is inputted to the high frequency amplifier 8 and amplified. As such, the output signal of the high frequency amplifier 8 is connected to the output side of the linear amplifier 9 to assist the amplification operation of the linear amplifier 9.

The output signal of the linear amplifier 9 and the output signal of the high frequency amplifier 8 are coupled and the coupled signal is coupled with the output signal 12 via the current-voltage converter 10. The output signal of the switching regulator 2 is also coupled with the output signal 12.

At this time, the DC component and low frequency components of the input signal 11 are amplified by the switching regulator 2 with high power efficiency. In addition, the high frequency components of the input signal 11 are amplified by the linear amplifier 9 and the high frequency amplifier 8 with high efficiency.

Figure 4:
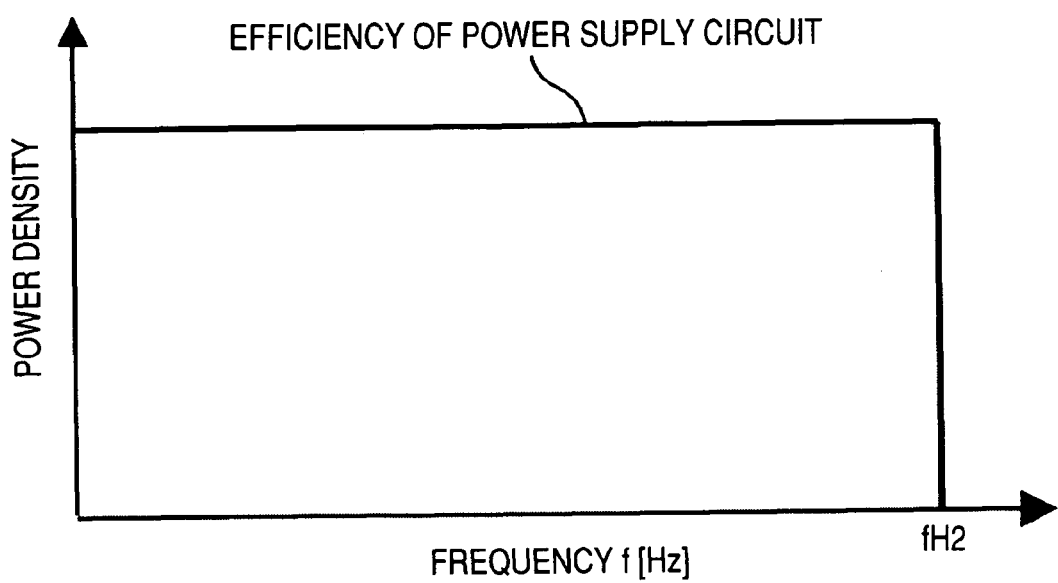
FIG. 4 is a graph illustrating a relationship between the power conversion efficiency and the operation frequency of a switching regulator according to the first embodiment.

According to the embodiment as mentioned above, the power of a signal having low frequency components is effectively amplified by the switching regulator and the power of a signal having high frequency components is effectively amplified by the linear amplifier or high frequency amplifier without generating any distortion. By doing so, as shown in FIG. 4, it may be possible to realize a broadband power supply circuit that consistently amplifies with high efficiency an input signal having broadband frequency components ranging from a DC component or low frequency component to a high frequency component and outputs the output signal.

Second Embodiment

Figure 5:
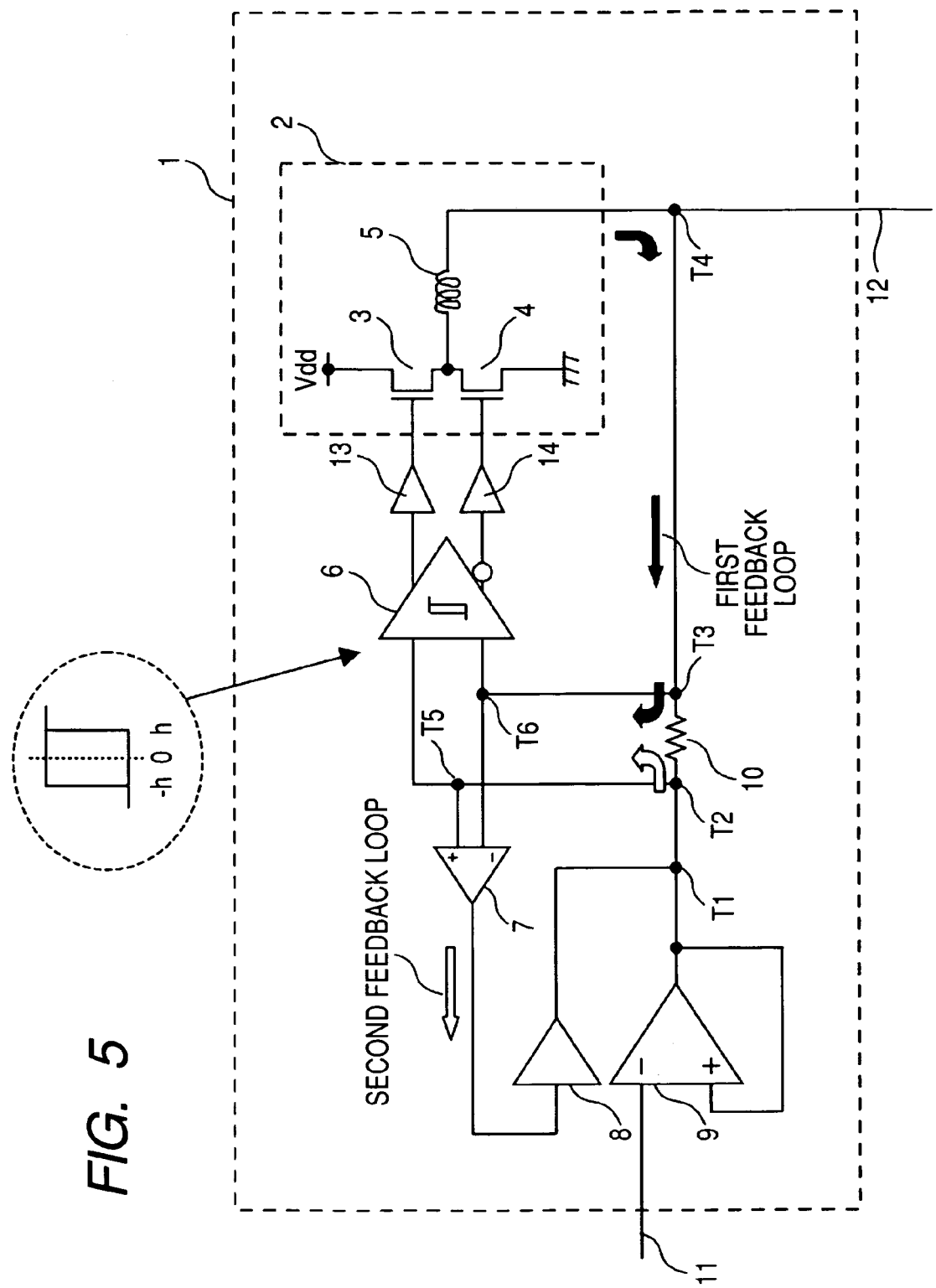
FIG. 5 is a block diagram illustrating a broadband power supply circuit according to a second embodiment of the present invention.

Further detailed constructional example of the broadband power supply circuit will be described as a second embodiment with reference to FIGS. 5 to 7. To begin with, FIG. 5 shows a block diagram illustrating a broadband power supply circuit according to a second embodiment.

In this embodiment, a first comparator 6 is configured as a D-class hysteresis comparator. A switching regulator 2 includes an inverter having a pair of CMOS transistors 3 and 4 that are connected between a DC voltage source Vdd and ground and an inductor 5 that is connected to the common contact point of drain terminals of the two CMOS transistors, and functions as a D-class amplifier. The output signal and the inverted output signal from the first (hysteresis) comparator 6 are inputted to the gate terminals of the pair of CMOS transistors 3 and 4, respectively. A second comparator 7 is configured as a general comparator or operational amplifier. A high frequency amplifier 8 is configured as an E-class high frequency amplifier, and a linear amplifier 9 is configured as a B-class or C-class linear voltage amplifier. Amplifiers 13 and 14 are positioned before the switching regulator 2. A current-voltage converter 10 is configured as a resistor having small resistance, so that the potentials are substantially equal to each other at both ends (terminals T2 and T3) of the resistor 10.

Hereinafter, an operation of the second embodiment will be described. An input signal 11 that includes a DC component to a high frequency component is amplified by the linear amplifier 9. The output signal of the linear amplifier 9 is detected by the resistor 10, and the detected result is inputted to and compared by the hysteresis comparator 6, which in turn outputs the compared result. The output signal of the hysteresis comparator 6 is inputted to the switching regulator 2. The switching regulator 2 amplifies the output signal of the hysteresis comparator 6 with high efficiency. Besides, the signal applied to both ends of the resistor 10 is also inputted to the comparator 7. The compared result of the second comparator 7 is inputted to and amplified by the high frequency amplifier 8. The output signal of the high frequency amplifier 8 is added to the output signal of the linear amplifier 9 to assist the amplification operation of the linear amplifier 9. That is, the output signal of the linear amplifier 9 and the output signal of the high frequency amplifier 8 are coupled with each other and the coupled signal is coupled with the output signal 12 via the resistor 10. In addition, the output signal of the inductor (inductance) 5 is coupled with the output signal 12 in the switching regulator 2.

At this time, the DC component and low frequency components of the input signal 11 are amplified by the switching regulator 2 with high efficiency. In the meanwhile, the high frequency components of the input signal 11 are amplified by the linear amplifier 9 or the high frequency amplifier 8 with high efficiency. Thus, the broadband power supply circuit 1 that consistently amplifies the broadband input signal 11 with high efficiency can be realized.

That is, as described above with reference to FIG. 2, at a band where the frequency of the input signal 11 is delayed, the power contribution ratio of the switching regulator 2 is large and therefore the input signal 11 is mainly amplified by the switching regulator 2. As the frequency band of the input signal 11 is raised and the amplification efficiency of the switching regulator 2 begins to be deteriorated, the power contribution ratio of the linear amplifier 9 increases correspondingly. If the frequency band of the input signal 11 is further raised, the amplification efficiency of the linear amplifier 9 also begins to be deteriorated. The amplification ratio of the high frequency amplifier 8 is designed to be maximized at a high frequency band which includes a predetermined high frequency component fH2, so that the amplification contribution ratio of the high frequency amplifier 8 is maximized at this band.

Thus, the power supply circuit 1 that has characteristics of a nearly constant power density with respect to the input signal 11 that has broadband frequency components ranging from a DC component or lower frequency component to a prescribed high frequency component fH2, in other words, that has a rectangular characteristic in the efficiency, and therefore consistently performs high-efficiency amplification and outputs the output signal 12 can be realized.

Hereinafter, an overall operation of the second embodiment will be described with reference to FIGS. 6 and 7.

Figure 6:
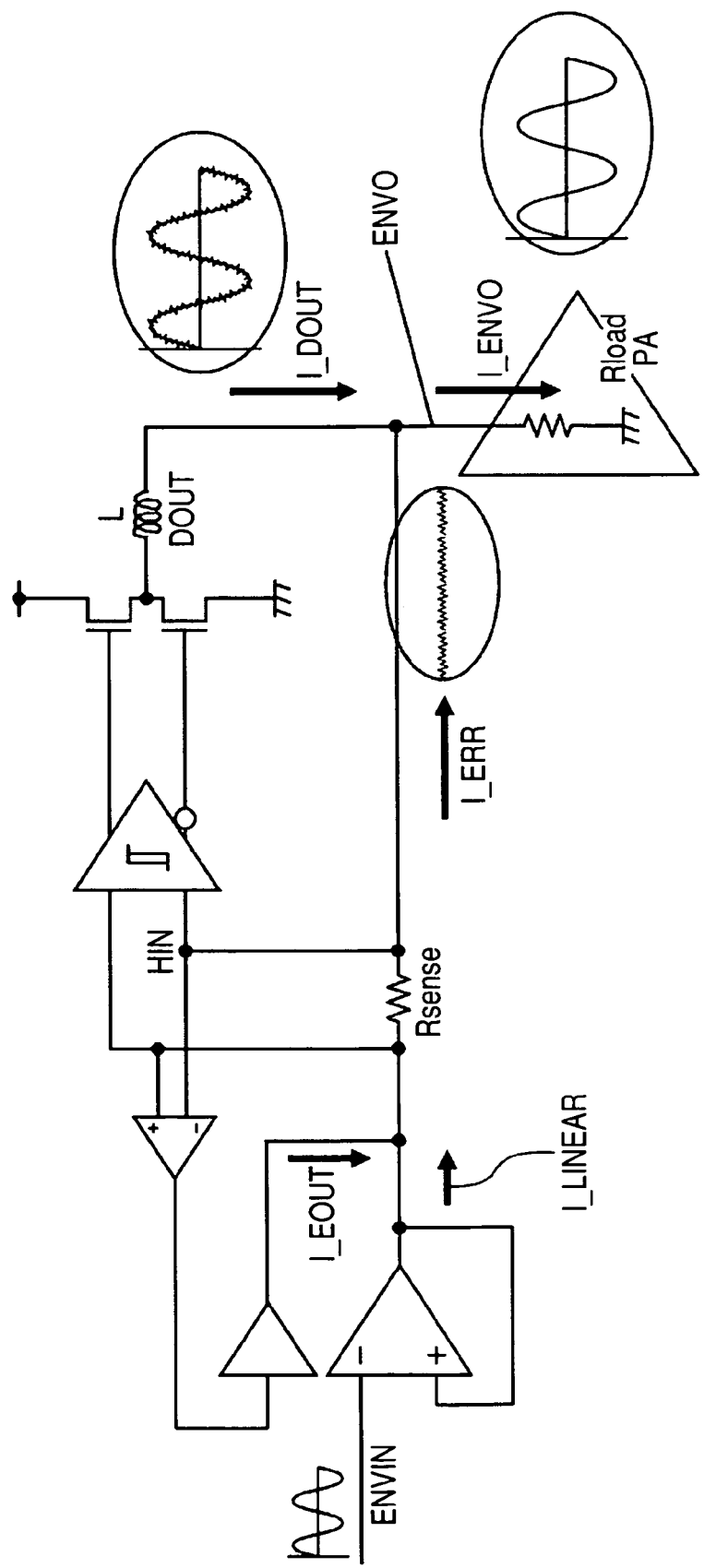
FIG. 6 is a view schematically illustrating conditions of a current flowing through each component of the broadband power supply circuit according to the second embodiment of the present invention.

FIG. 6 is a view schematically illustrating conditions of each current flowing through each component of the broadband power supply circuit 1. In FIG. 7, (a) and (b) are views illustrating an operation of the switching regulator 2. Here, ENVIN refers to an input signal (voltage value) inputted to the linear amplifier 9, I_LINEAR refers to an output signal (current value) of the linear amplifier 9, I_EOUT refers to an output signal (current value) of the high frequency amplifier 8, Rsense refers to resistance of the resistor 10, HIN refers to an input voltage inputted to the hysteresis comparator 6 and the high frequency amplifier 8, DOUT refers to an output voltage of the inverter, I_DOUT refers to an output current of the inverter, I_ERR refers to a current between the terminals T2 and T3, and I_ENVO refers to an input current inputted to a power amplifier PA. The output signal 12 (voltage ENVO) of the power supply circuit 1 is a signal inputted to the power amplifier PA.

Assuming that the internal resistor of the power amplifier PA is Rload,
ENVO=ENVIN, and
I_ENVO=ENVO/Rload.

Meanwhile, the output signal of the linear amplifier 9 and the output signal of the high frequency amplifier 8 are coupled with each other, and therefore, the current flowing between the terminals T1 and T2 is as follows:
I_LINEAR+I_EOUT.

And, the input current inputted to the power amplifier PA is as follows:
I_ENVO=I_DOUT+I_ERR
When I_DOUT=ENVIN/Rload,
I_ERR→DC component=0, and
thus I_ERR has the AC components only.

First, an operation will be described below under the conditions that the switching regulator 2 has a high contribution ratio for power density.

Figure 7:
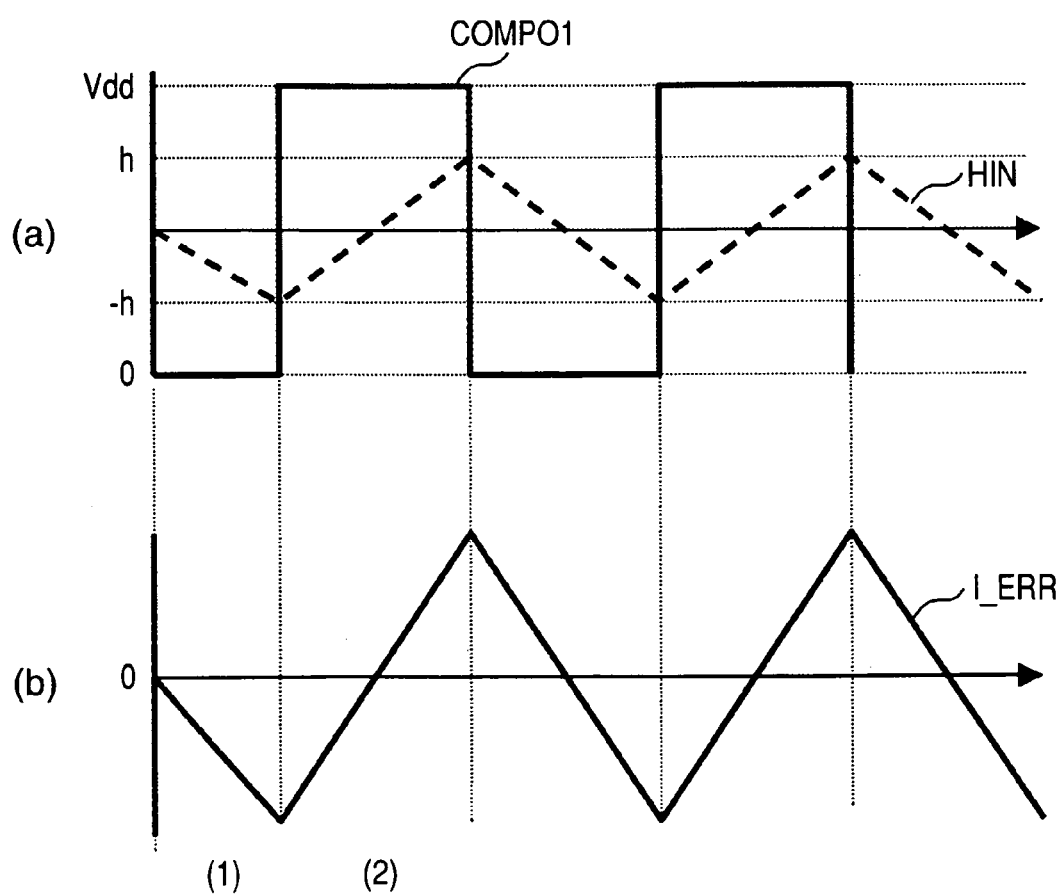
FIG. 7 is a view illustrating an operation of a switching regulator according to the second embodiment of the present invention.

It is considered herein as shown in (1) of FIG. 7 that the output signal L(COMPO-1=L) of the hysteresis comparator 6 is inputted to the gate terminal of the CMOS transistor 3 and the inverted output signal H is inputted to the gate terminal of the CMOS transistor 4.

At this time, the CMOS transistor 3 is turned on and the CMOS transistor 4 is turned off, so that the output voltage of the inverter is as follows: DOUT=Vdd. Besides, the output current of the inverter is as follows: I_DOUT=(1/L)∫(Vdd−ENVO) dt.

At this time, I_ERR<0
HIN=Rsense*I_ERR<0.
When HIN=−h, then COMPO-1=H.
Next, when COMPO-1=H as shown in (2) of FIG. 7,
DOUT=0
I_DOUT=(1/L)∫(0−ENVO) dt
I_ERR>0,
Then, HIN=Rsense*I_ERR>0.
when HIN=h, COMPO-1=L.

As such, the current I_ERR flowing through the power supply circuit 1 varies as shown in FIG. 7, (b).

The current I_ERR corresponds to a current supplied to the resistor 10 by the linear amplifier 9 or the linear amplifier 9 and the high frequency amplifier 8. Furthermore, the current I_ERR is a current that cancels noise components (ripple currents) included in the current I_DOUT according to the operation of the switching regulator at high speed. As shown in FIG. 6, the ripple currents contained in I_ERR are fed back through the first feedback loop and the second feedback loop and therefore the ripple currents are not included in the input current I_ENVO inputted to the I_ERR power amplifier PA.

Next, an operation will be described below under the conditions that the switching regulator 2 has the contribution ratio lowered for power density.

In this embodiment,
Assuming that,
b: amplification efficiency of the linear amplifier 9,
b+α: amplification efficiency of the high frequency amplifier 8,
x: amplification contribution ratio of the amplifiers 8 and 9, and
B: amplification efficiency of the amplifiers 8 and 9 that are combined with each other,
the amplification efficiency B is as follows:

$B=bx+(b+\alpha)(1-x)=b+\alpha-\alpha x=b+\alpha(1-x)$

For example, if b=20%, x=40%, and (b+α)=100%, then B=b+α(1−x)=68%.

That is, the amplification efficiency at the high frequency band when the linear amplifier 9 is only employed, i.e., b=20%, is significantly improved by adding the high frequency amplifier 8, i.e., amplification efficiency B=68%.

As such, it can be possible according to this embodiment to realize the power supply circuit 1 that can amplify the input signal 11 with high efficiency.

Third Embodiment

Figure 8:
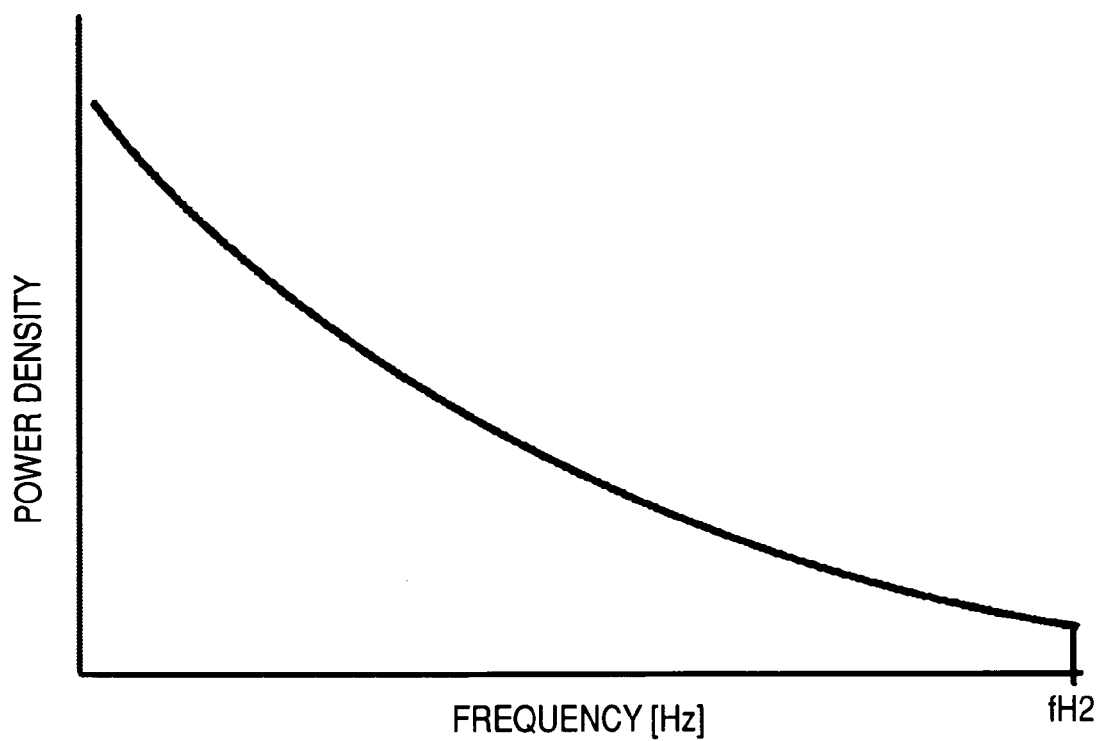
FIG. 8 is a graph illustrating a relationship between the frequency and the power density of an input signal according to a third embodiment of the present invention.

FIG. 8 shows a relationship between the frequency of an input signal and the overall power density according to a third embodiment. As shown in FIG. 8, the broadband power supply circuit 1 sometimes requires a characteristic with different external power density, i.e. a characteristic when the entire power density is lowered as the frequency goes to a high frequency with respect to the input signal 11 that includes broadband frequency components from a DC component or lower frequency component to a prescribed high frequency component fH.

Even in this requirement, the amplification of the low frequency components is performed by the switching regulator and the amplification of the high frequency components is performed by the linear amplifier and the high frequency amplifier.

Any one of amplifiers of A-class, AB-class, B-class, and C-class amplifiers, may be used as the linear amplifier 9 in the broadband power supply circuit 1 according to this embodiment. Also, any one of amplifiers of E-class and F-class amplifiers, may be used as the high frequency amplifier 8. Any one of a hysteresis comparator, a PWM (Pulse Width Modulation) comparator, and a general comparator may be used as the first comparator 6. In addition, the PWM comparator functions as a voltage-pulse width converter that controls the output voltage in response to the input voltage from the terminals 5 and 6.

According to this embodiment, power of a signal having low frequency components is effectively amplified by the switching regulator, and power of a signal having high frequency components is effectively amplified by the linear amplifier or high frequency amplifier without any distortion. Accordingly, it may be possible to realize a power supply circuit that may amplify a broadband signal more effectively than the prior art.

Fourth Embodiment

An EER-type amplifier according to a fourth embodiment will be described with reference to FIG. 9.

Figure 9:
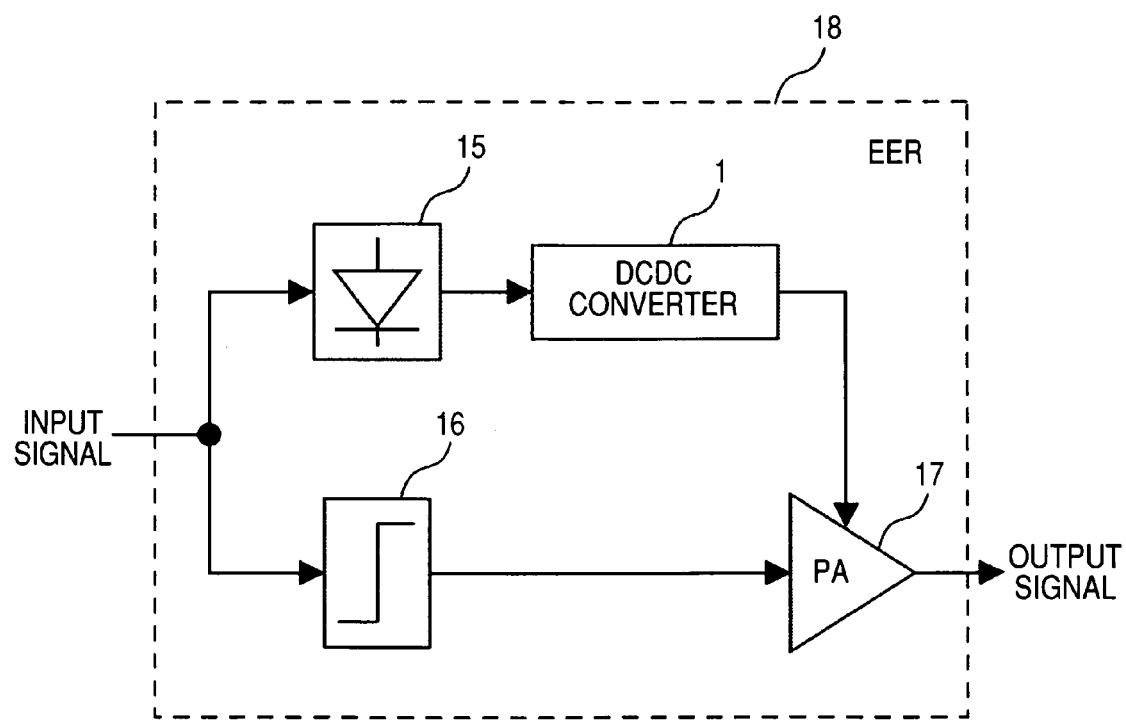
FIG. 9 is a block diagram illustrating an EER-type amplifier according to a fourth embodiment of the present invention.

The EER-type amplifier shown in FIG. 9 is an EER amplifier that employs the broadband power supply circuit according to the first embodiment. The EER-type amplifier 18 includes an envelope detecting means 15, a limiter 16, a power supply circuit 1, and a carrier amplifier 17. The broadband power supply circuit 1 according to the first embodiment is employed as the power supply circuit 1.

Next, an operation of the EER-type amplifier will be described.

Amplitude information AM is extracted from an input signal, which is a high frequency signal, by the envelope detecting means 15. On the other hand, phase information PM is extracted from the input signal by the limiter 16. The amplitude information AM is amplified by the power supply circuit 1 and supplied to the power terminal of the carrier amplifier 17. And, the phase information PM is supplied to the input terminal of the carrier amplifier 17.

Even though the amplitude information AM of the input signal is removed once by the limiter 16, the amplitude information AM is still supplied to the power terminal of the carrier amplifier 17, and the removed amplitude information is recovered by the carrier amplifier 17. Since the EER-type amplifier 18 is designed so that the carrier amplifier 17 is always operated while saturated without assistance of the input power and further the power supply circuit 1 that amplifies the amplitude information AM is highly effective, the EER-type amplifier 18 is highly effective as a whole.

That is, the power supply circuit 1 may always perform a high-efficiency amplification operation even though a broadband signal used for a communication system such as WiMAX, whose frequency reaches a few tens of MHz is inputted to the power supply circuit 1. By doing so, it may be possible to obtain an EER amplifier that has such a high conversion efficiency that may apply only to a base station at a broad band ranging from a few 100 KHz to about 100 MHz.

As such, the EER-type amplifier according to this embodiment may realize a high-efficiency operation even in a case where a broadband amplitude modulation signal, such as a WiMAX signal, which is not likely to be processed by the conventional power supply circuit, is inputted to the EER-type amplifier.

In addition, a feedback that compares the output signal and the input signal of the carrier amplifier 17 may be performed to correct AM-PM distortion or AM-AM distortion. Further, pre-distortion may be performed.

According to the embodiment, it may be possible to provide a high-efficiency EER-type amplifier with respect to a high-speed, broadband wireless scheme.

Fifth Embodiment

Figure 10:
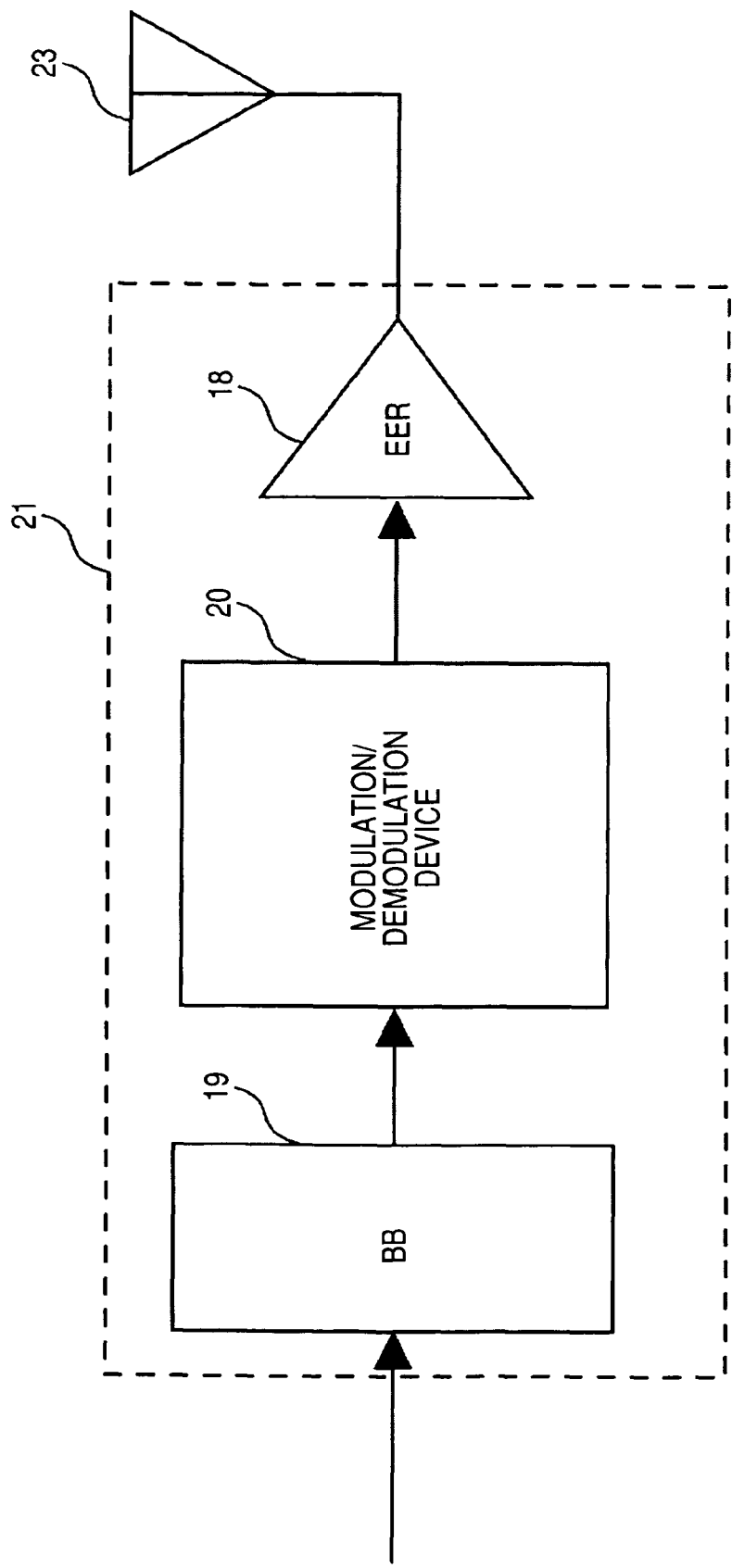
FIG. 10 is a block diagram illustrating a base station device according to a fifth embodiment of the present invention.
Figure 11:
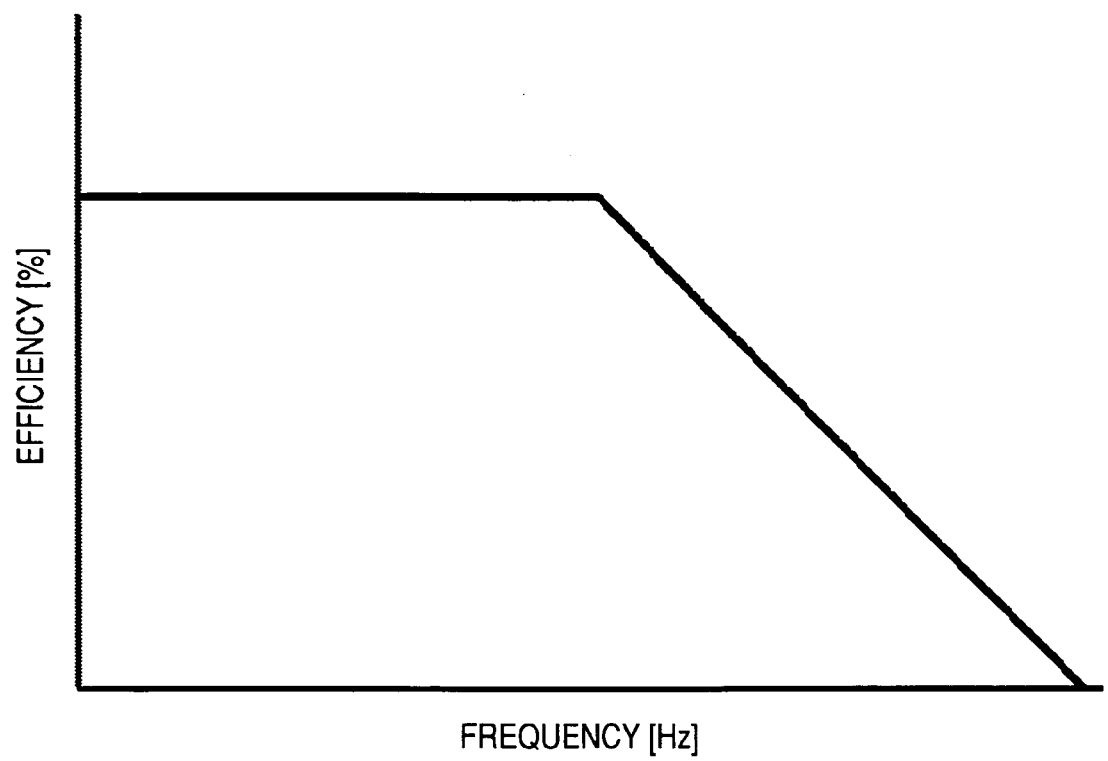
FIG. 11 is a graph illustrating a relationship between the operation frequency and the power conversion efficiency of a general switching regulator of the prior art.

Next, a base station device according to an embodiment will be described with reference to FIG. 10. The base station device 21 shown in FIG. 10 employs the EER-type amplifier 18 according to the fourth embodiment. That is, the base station device 21 includes a baseband unit 19, a modulation/demodulation device 20, and an EER-type amplifier 18.

Hereinafter, an operation of the base station device will be described.

Transmission information is processed by the baseband unit 19, modulated by the modulation/demodulation device 20, amplified by the EER-type amplifier 18, and transmitted by an antenna 23. Since the EER-type amplifier 18 is an EER-type amplifier that employs the broadband power supply circuit 1 according to the first embodiment, the EER-type amplifier 18 realizes a high-efficiency operation even in a broadband wireless scheme, such as WiMAX, which is not likely to be processed by the conventional EER-type amplifier.

In addition, pre-distortion may be performed such that distortion is corrected by inputting the output signal of the EER-type amplifier 18 to, for example, the baseband unit 19.

According to this embodiment, it may be possible to provide a high-efficiency base station device in a high-speed broadband wireless scheme.

Furthermore, it is needless to say that the broadband, high-efficiency power supply circuit and the amplifier using the power supply circuit may be widely applied to a portable terminal or a terminal mounted in vehicles, a terminal mounted in digital appliances, and other radio communication systems that use broadband, high-speed signals, as well as the base station.

What is claimed is:

1. A power supply circuit comprising:
   a linear amplifier which receives a broadband input signal from an input terminal;
   a current-voltage converter arranged between an output side of the linear amplifier and an output terminal;
   a switching regulator that amplifies a voltage difference generated across the current-voltage converter, converts the amplified voltage difference into a current, and outputs the converted current to the output terminal; and
   a high frequency amplifier that amplifies a voltage difference generated across the current-voltage converter, converts the amplified voltage difference into a current, and outputs the converted current,
   wherein an output current of the high frequency amplifier is added to an output current of the linear amplifier and supplied to the current-voltage converter, and
   wherein the high frequency amplifier has the maximized amplification contribution ratio at a high frequency band of the broadband input signal.

2. The power supply circuit according to claim 1, further comprising:
a first comparator and a second comparator, each of which receives an input voltage having a voltage generated across the current-voltage converter,
wherein an output of the first comparator is inputted to the switching regulator,
wherein an output of the second comparator is inputted to the high frequency amplifier,
wherein an output current of the high frequency amplifier is supplied between an output side of the linear amplifier and the current-voltage converter, and
wherein an output current of the switching regulator is supplied between the current-voltage converter and the output terminal.

3. The power supply circuit according to claim 1, wherein the high frequency amplifier is a digital amplifier.

4. The power supply circuit according to claim 1, wherein the broadband input signal includes a DC component to a high frequency component.

5. The power supply circuit according to claim 1, wherein the current-voltage converter is a resistor having small resistance.

6. The power supply circuit according to claim 2, wherein each of the first comparator and the switching regulator is configured as a D-class amplifier.

7. The power supply circuit according to claim 6, wherein the first comparator is a hysteresis comparator.

8. The power supply circuit according to claim 6, wherein the first comparator is a PWM comparator.

9. The power supply circuit according to claim 6, wherein the switching regulator includes:
an inverter whose input side is connected to the first comparator; and
an inductor connected to an output terminal of the inverter.

10. The power supply circuit according to claim 9, wherein the inverter includes a pair of CMOS transistors.

11. The power supply circuit according to claim 1, wherein the linear amplifier is configured as a B-class or C-class amplifier.

12. The power supply circuit according to claim 1, wherein the high frequency amplifier is configured so that its power amplification contribution ratio increases at a higher frequency band than that of the linear amplifier and the switching regulator.

13. The power supply circuit according to claim 12, wherein the high frequency amplifier is configured to have maximized amplification efficiency at the high frequency band.

14. The power supply circuit according to claim 1, wherein the power amplification contribution ratio of the switching regulator is maximized at a first frequency band of the input signal which ranges from a DC component to a low frequency component,
wherein the power amplification contribution ratio of the linear amplifier is maximized at a second frequency band higher than the first frequency band, and
wherein the power amplification contribution ratio of the high frequency amplifier is maximized at a further higher, third frequency band.

15. The power supply circuit according to claim 14, wherein power density is nearly constant with respect to the input signal including broadband frequency components that range from the DC component to a high frequency component of the third frequency band.

16. A power amplifier comprising:
an envelope detecting means that extracts amplitude information of an input signal;
a limiter that extracts phase information of the input signal;
a broadband power supply circuit that processes a detection output signal of the envelope detecting means; and
a carrier amplifier that receives a limiter output signal of the limiter as an input signal and a conversion output signal of the broadband power supply circuit as a power source, and amplifies power of the input signal,
wherein the broadband power supply circuit includes:
a linear amplifier which receives a broadband input signal from an input terminal;
a current-voltage converter arranged between an output side of the linear amplifier and an output terminal;
a switching regulator that amplifies a voltage difference generated across the current-voltage converter, converts the amplified voltage difference into a current, and outputs the converted current to the output terminal; and
a high frequency amplifier that amplifies a voltage difference generated across the current-voltage converter, converts the amplified voltage difference into a current, and outputs the converted current,
wherein an output current of the high frequency amplifier is added to an output current of the linear amplifier and supplied to the current-voltage converter, and
wherein the high frequency amplifier has the maximized amplification contribution ratio at a high frequency band of the broadband input signal.

17. The power amplifier according to claim 16, wherein the high frequency amplifier is a digital amplifier.

18. The power amplifier according to claim 16, wherein the high frequency amplifier is an EER-type amplifier that corresponds to a communication system for WiMAX.

19. A base station device comprising:
a baseband unit that processes transmission information;
a modulation and demodulation device that modulates and demodulates a signal processed by the baseband unit; and
a power amplifier that amplifies power of a signal processed by the modulation and demodulation device and outputs the amplified power of the signal to an antenna,
wherein the power amplifier includes:
an envelope detecting means that extracts amplitude information of an input signal;
a limiter that extracts phase information of the input signal;
a broadband power supply circuit that processes a detection output signal of the envelope detecting means; and
a carrier amplifier that receives a limiter output signal of the limiter as an input signal and a conversion output signal of the broadband power supply circuit as a power source, and amplifies power of the input signal,
wherein the broadband power supply circuit of the power amplifier includes:
a linear amplifier which receives a broadband input signal through an input terminal;
a current-voltage converter arranged between an output side of the linear amplifier and an output terminal;
a switching regulator that amplifies a voltage difference generated across the current-voltage converter, converts the amplified voltage difference into a current, and outputs the converted current to the output terminal; and
a high frequency amplifier that amplifies a voltage difference generated across the current-voltage converter, converts the amplified voltage difference into a current, and outputs the converted current, wherein an output current of the high frequency amplifier is added to an output current of the linear amplifier and supplied to the current-voltage converter, and wherein the high frequency amplifier has the maximized amplification contribution ratio at a high frequency band of the broadband input signal.

20. The base station device according to claim 19, wherein the high frequency amplifier is an EER-type amplifier that corresponds to a communication system for WiMAX.

\* \* \* \* \*